United States Patent [19]

Privee

[11] 4,051,424
[45] Sept. 27, 1977

[54] DIGITAL AMP-HOUR MONITOR

[75] Inventor: James A. Privee, San Diego, Calif.

[73] Assignee: The United States of America as represented by the Secretary of the Navy, Washington, D.C.

[21] Appl. No.: 704,906

[22] Filed: July 13, 1976

[51] Int. Cl.² .............................................. H01M 45/06
[52] U.S. Cl. ..................................... 320/48; 324/29.5; 340/249
[58] Field of Search ............................ 320/48, 43, 44; 235/150.51, 151.31; 340/249; 324/29.5, 76 A

[56] References Cited

U.S. PATENT DOCUMENTS

| | | | |
|---|---|---|---|
| 3,740,636 | 6/1973 | Hogrefe et al. | 320/44 X |
| 3,786,343 | 1/1974 | Ehlers | 320/48 |
| 3,895,284 | 7/1975 | Schweizer et al. | 320/48 |
| 3,898,548 | 8/1975 | Perelle et al. | 320/48 |

Primary Examiner—Robert J. Hickey
Attorney, Agent, or Firm—Richard S. Sciascia; Ervin F. Johnston; William T. Skeer

[57] ABSTRACT

An amp-hour monitor is provided to determine the power expended by a marine battery power supply system. Digital processing circuitry monitors a selected battery system and provides a readout of the power expended using a digital display. Additionally, a display of on-line current being drawn from the individual battery packs is displayed.

6 Claims, 19 Drawing Figures

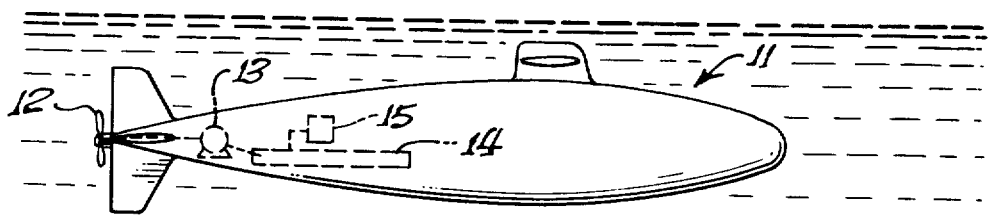
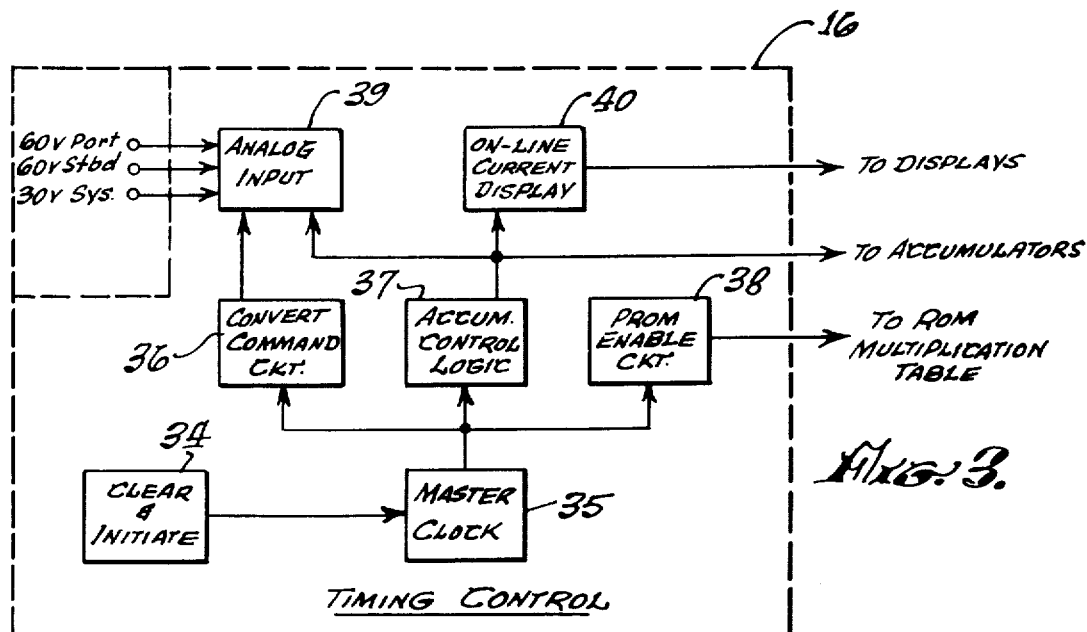
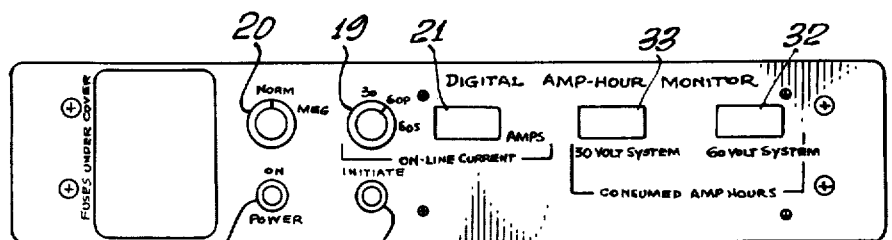
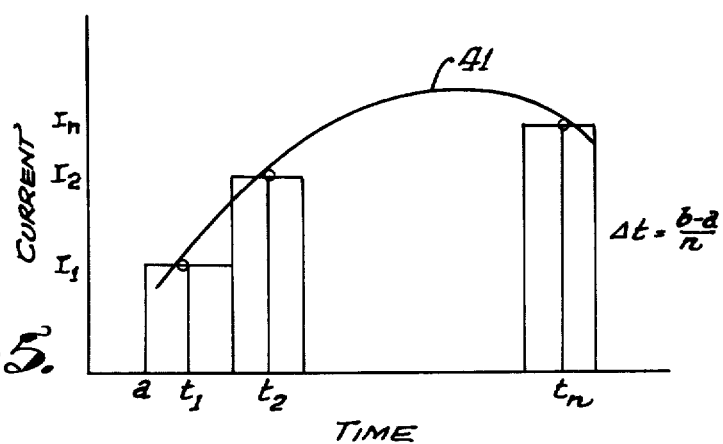

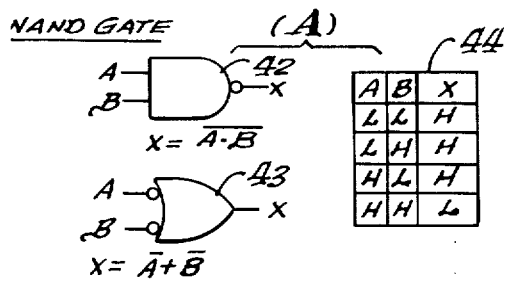
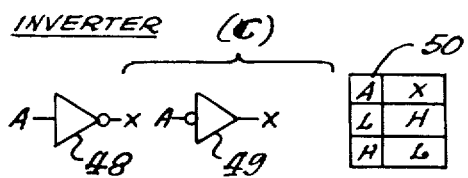
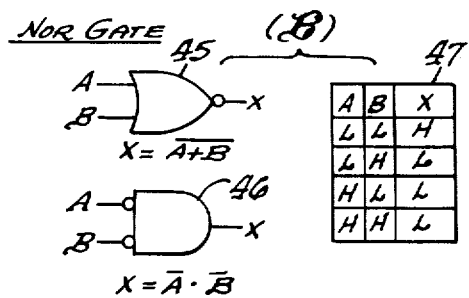
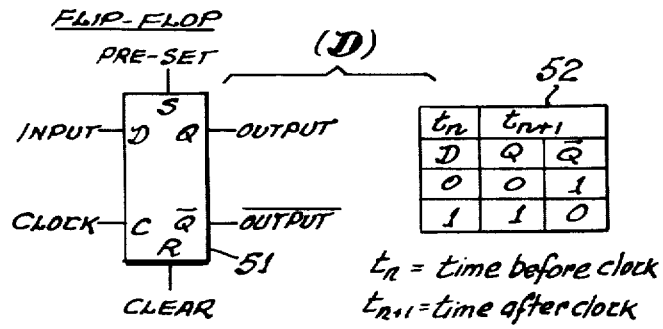
*FIG. 6.* FUNCTIONAL DESCRIPTION
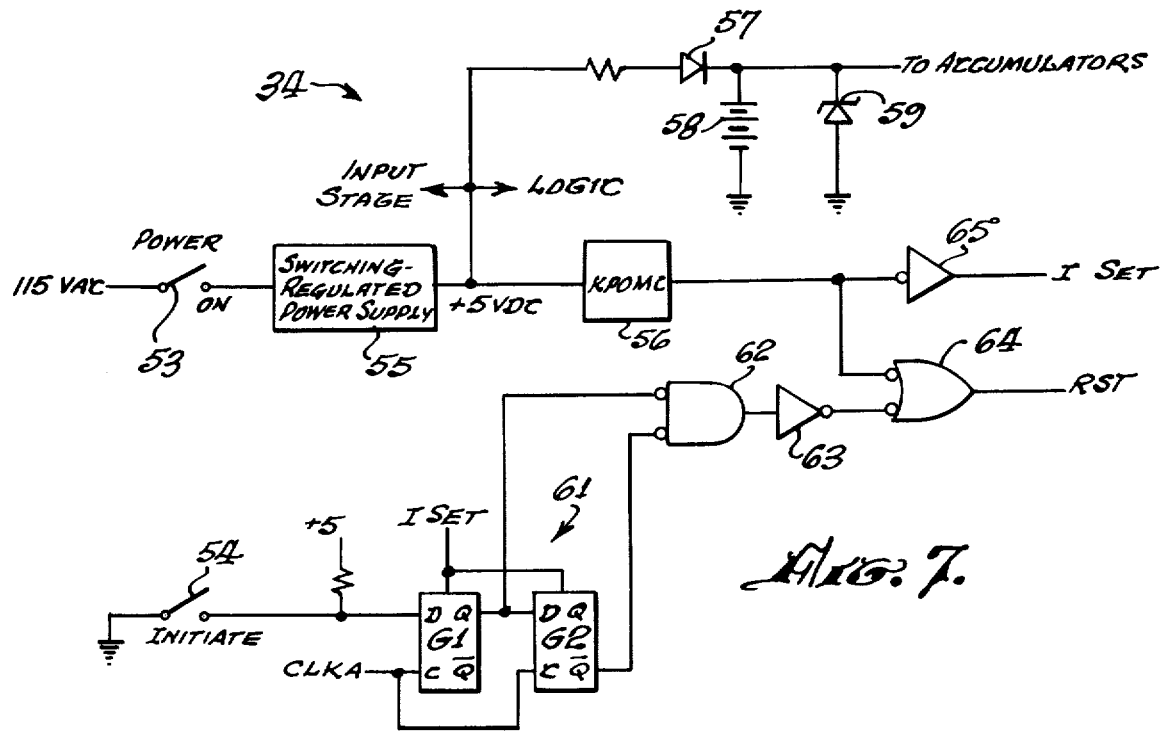
*FIG. 7.*

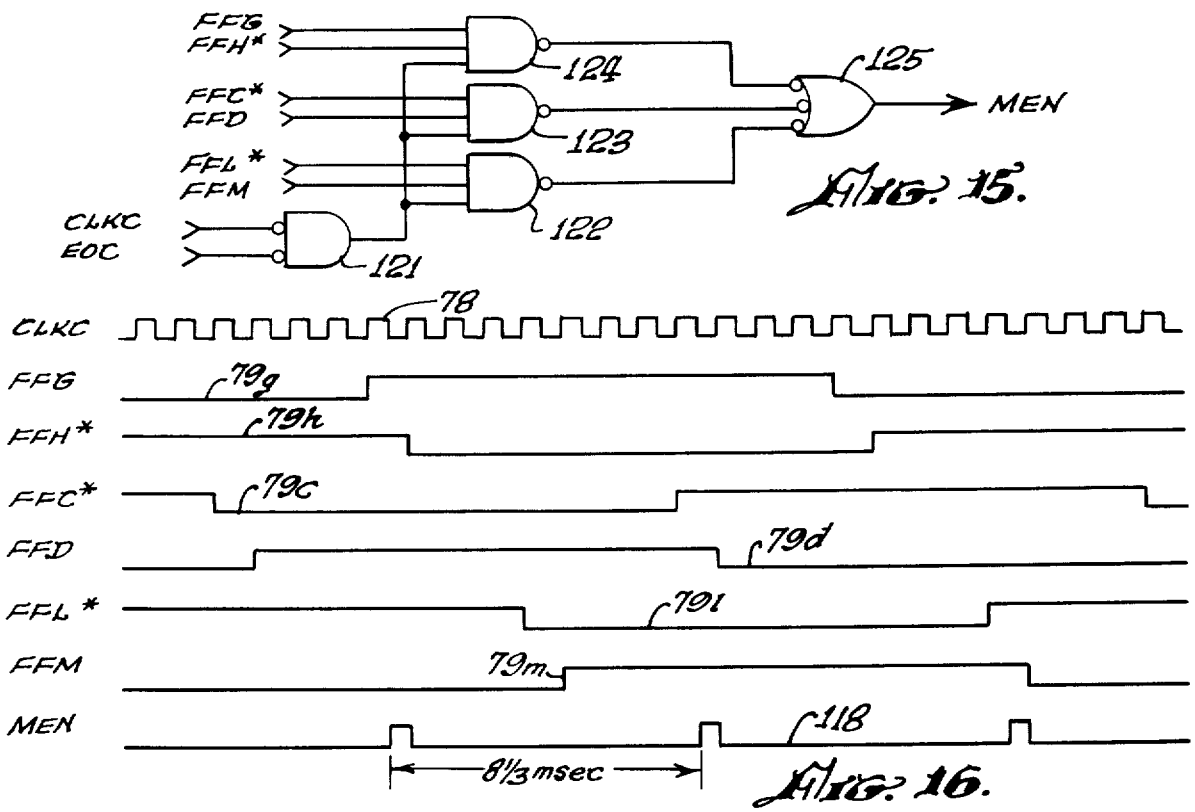
Fig. 15.
Fig. 16.
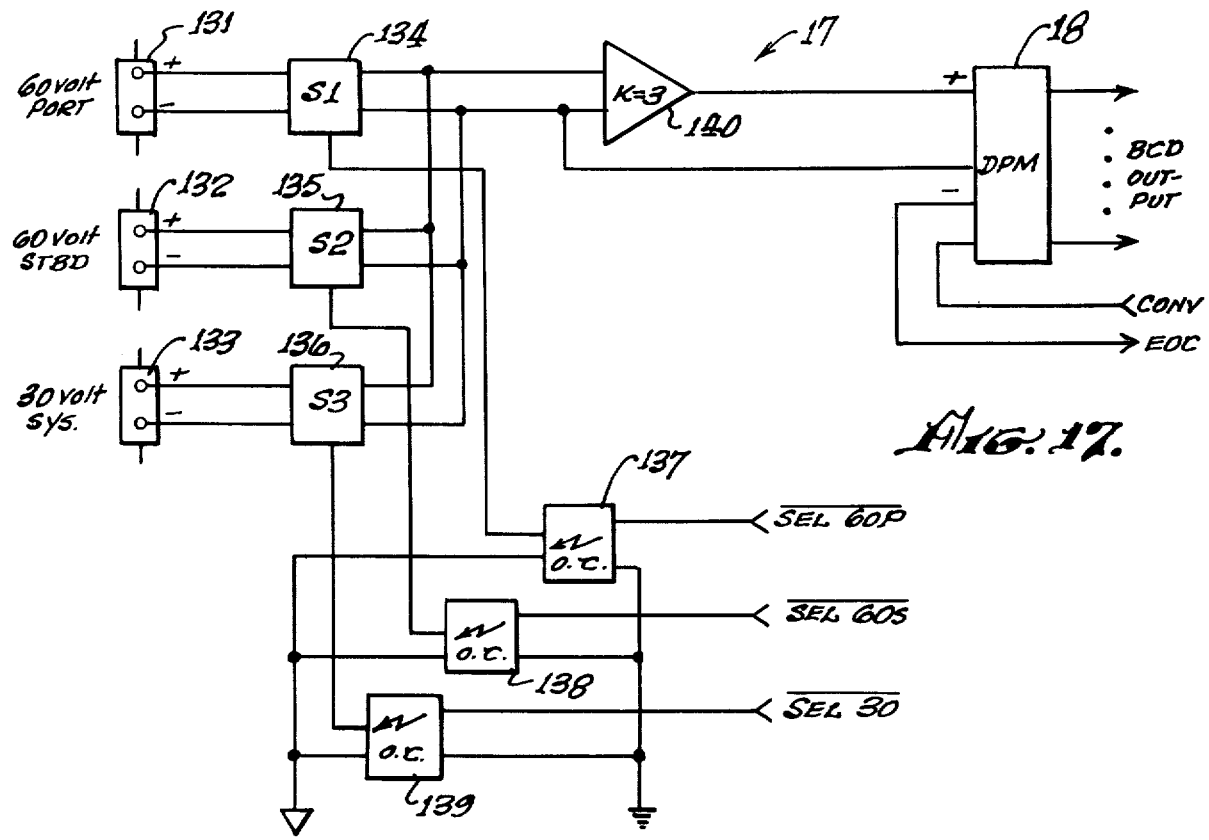
Fig. 17.

DIGITAL AMP-HOUR MONITOR

STATEMENT OF GOVERNMENT INTEREST

The invention described herein may be manufactured and used by or for the Government of the United States of America for governmental purposes without the payment of any royalties thereon or therefor.

FIELD OF THE INVENTION

This invention pertains to the field of electricity and, in particular, that branch thereof concerning battery and condenser charging and discharging arts. By way of further characterization, the invention is directed toward electrical measurement of power. In still greater particularity, the invention relates to an improved instrumentation system used to measure amp-hours. By way of further characterization, but without limitation thereto, the invention relates to an improved amp-hour monitor for battery powered submarine vehicles.

DESCRIPTION OF THE PRIOR ART

The advantages of electric drive propulsion for deep submergence vehicles and oceanographic submersibles has long been recognized. The electrical drive system is powered by one or more banks of electrical storage batteries. Because of the space premium and close quarters in such submarine vessels, the battery packs are generally limited in size to a minimum required for the anticipated voyage. Thus, in operational circumstances it becomes important to known precise amount of power remaining in the battery pack. For safety reasons a necessary power reserve must be maintained in order to permit surfacing and docking maneuvers to be performed at the end of the dive.

The old method of determining the power expended was to measure the current flow by means of an E-cell. This measuring technique is well understood in the prior art but its operation requires leaving the cell in the line for a period of time during which ions migrated from one plate to another within the cell. After the period of time, the cell was removed from the line and reversed such that the ion migration was reversed at which time the ampere-hour value was determined. Essentially this is a mechanical method and has the disadvantage of not providing a real-time-indication of the power consumed.

Further, the E-cell measuring system was relatively large in size such that it occupied a disproportionate amount of valuable space within the submersible. Because of these operational inconveniences operational personnel left larger margins of safety than was required in order to compensate for deficiencies of this system.

SUMMARY OF THE INVENTION

This invention is directed to a monitoring system to be used in deep submersible systems which is capable of providing a real-time monitor of a plurality of battery systems. Circuitry is provided which provides a fail-safe protection system to preserve existing readings in the event of a power failure condition. Additionally, a digital display permits operational personnel to determine the amount of power consumed from either of the monitored system and thereby readily determine the remaining power. Further, circuitry is provided to indicate an on-line current display indicating the instantaneous current drain of the monitored battery systems. Circuit design has been optimized to provide for a small current requirement by using all solid state equipment. This design and circuitry layout has the additional advantage of extremely compact physical dimensions. Additional switching circuitry provides for megger measurements and has a further advantage of requiring little operational training and attention during the course of a dive.

STATEMENT OF THE OBJECTS OF THE INVENTION

It is accordingly an object of this invention to provide an improved electrical measuring system.

It is accordingly an object of this invention to provide an improved shipboard measuring system.

Another object of this invention is to provide for a measuring system for use in conjunction with storage batteries.

A further object of this invention is to provide for a battery monitoring system which indicates the power consumed by the system.

Still another object of this invention is to provide for a monitoring system having a digital read-out.

Yet another object of this invention is to provide for a battery monitoring system having an indication provision for on-line current.

A further object of this invention is to provide a lightweight compact dimensioned, solid-state monitoring circuit for deep submersible oceanographic vehicles.

Still another object of this invention is to provide for a monitoring system for use in deep submergence vessels which provide a real-time display of amp-hour values of power consumed by the electrical system of the vehicle.

Other objects, advantages, and novel features of the invention will become apparent from the following detailed description of the invention, when considered in conjunction with the accompanying drawings.

BRIEF DESCRIPTION OF THE DRAWINGS

FIG. 1 is a side elevation view of a submersible in an operational environment incorporating the invention;

FIG. 3 is a schematic representation of the timing control circuit shown in FIG. 2;

FIG. 4 is a front elevation view of the assembled system;

FIG. 5 is a graphic representation illustrating the mathematical principals of operation of the system;

FIGS. 6a, b, c, and d are diagrammatic views and truth tables of the various individual circuit elements employed in the invention;

FIG. 7 is a schematic view of the power supply and initiating circuit of the invention;

FIG. 15 is a schematic representation of the programmed read-only memory enable circuit;

FIG. 16 is a waveform diagram showing the operational states of the circuit of FIG. 15;

FIG. 17 is a schematic representation of the analog input circuit;

DESCRIPTION OF THE PREFERRED EMBODIMENTS

Figure 2:
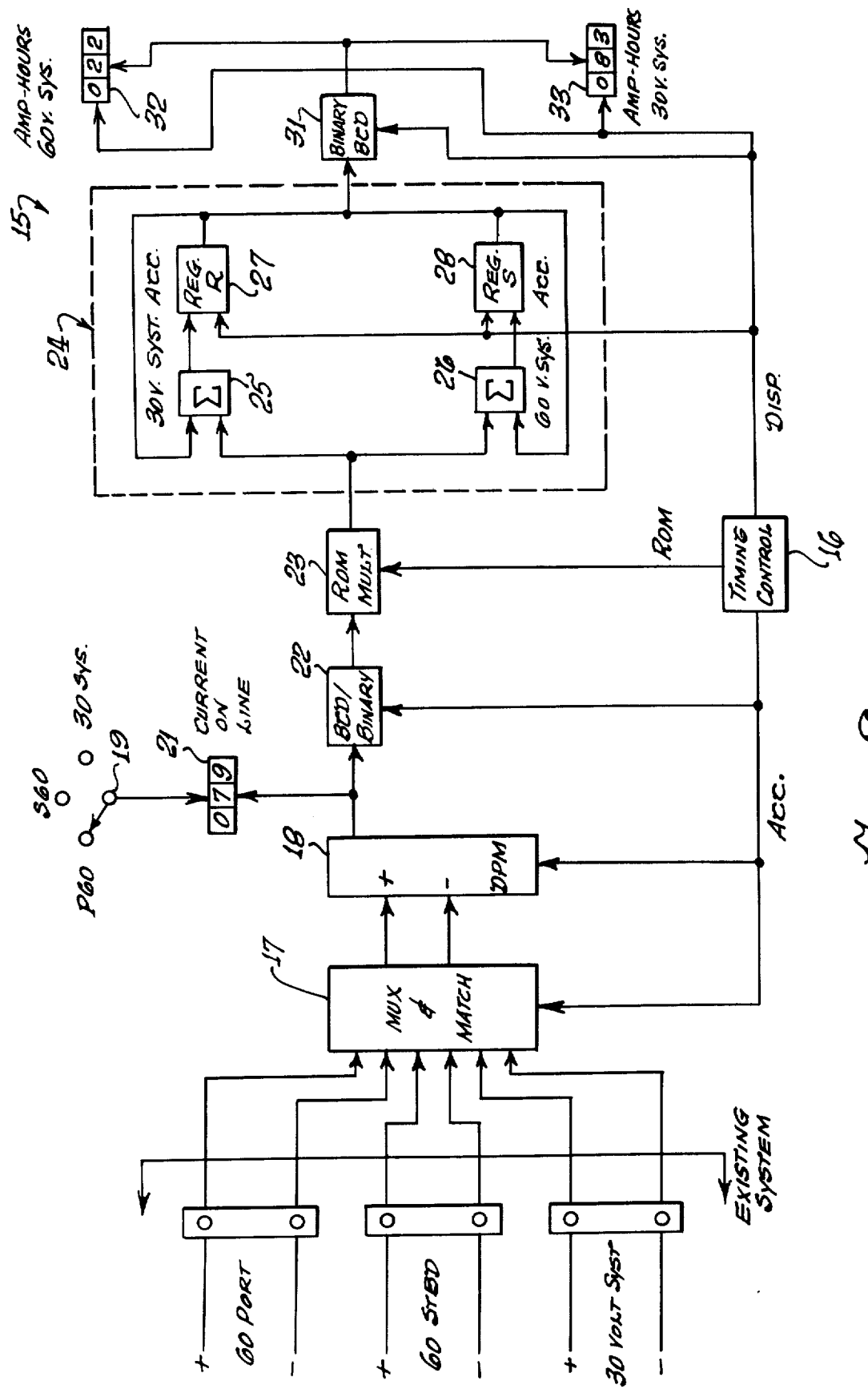
FIG. 2 is a block diagram indicating the major operational components comprising the system.

Referring to FIG. 1, a submersible vessel 11 is illustrated in an underwater environment. Submersible 11 is propelled by an external, aftmounted marine screw 12. An electric drive motor 13 is operatively connected to screw 12 as indicated by the broken lines to provide propulsive rotary force therefore. Motor 13 is, in turn, electrically connected to an electric energy source 14 which, in the instant case, is a storage battery bank. The monitoring system of the invention is indicated generally at 15 and, by broken line, is shown as being connected to the battery bank 14 to provide effective measurement thereof.

Referring to FIG. 2 a diagrammatic representation of the complete amp-hour monitor is illustrated. As shown, provision is made for attaching the system to the existing electrical system of the submersible including two 60 volt battery banks and a auxiliary 30 volt system. It will be observed that the inputs from the batteries have floating ground as is conventional in the submersible vehicle arts. The input line voltages are connected to an analog input circuit 17 which provides for multiplexing the various signals and impedance matching them into the system of the invention. The output from analog circuit 17 is, in turn, connected to a digital panel meter 18 which includes the analog-to-binary coded digital signals necessary to operate a current on-line display 21. The particular voltage displayed is selected by a switch 19 to indicate either the port or starboard 60 volt system or the auxiliary 30 volt system. Additionally, the output from the digital panel meter 18 is connected to a binary code digital to binary code converter 22. The purpose of BCD/binary converter 22 is, of course, to convert the displayed signals into conventional binary signals such that they may be processed to indicate the entire power consumed in ampere-hours.

The output of BCD/binary circuit 22 is connected to a read-only memory multiplying table 23 which, additionally receives signals from the timing control circuit 16. Timing control circuit 16 may be regarded as the heart of the digital amp-hour monitor of the invention in that it provides the necessary synchronizing and gating signals to the remaining circuit elements. As indicated, additional outputs from timing control circuit 16 are connected to the analog input circuit 17 and the digital panel meter 18.

The output of read-only memory circuit 23 is connected to an accumulator system 24. As illustrated, the accumulator system includes a summation circuit 25 which, in turn, is connected to a register 27 to keep an accumulated total of the 30 volt system. Similarly, a mirror system comprising a summation circuit 26 and a register 28 provides an accumulated amp-hour monitor of the 60 volt system. The output of accumulator 24 is fed to a binary-to-binary coded digital converter 31 which, in turn, provides the operational signals for digital panel meters 32 and 33.

Except for the elements in analog input circuit 17 and timing control circuit 16 to be discussed below, the individual digital panel meters and BCD stroke binary converters are conventional circuits available in the art.

Referring to FIG. 3, a diagrammatic illustration of the timing control 16 is illustrated. As shown, a clear and initiate circuit 34 provides the power switching and initial circuit pulses and is connected to a master clock 35. Master clock 35 provides the initial timing signal which provide the synchronizing and time correlation between the various circuit components of the system. Master clock 35 provides driving signals connected to the convert command circuit 36 and accumulator control logic circuit 37 and a programmed read-only memory enable circuit 38. The outputs from these various circuits provide the time basis by which the other circuits are controlled.

The convert command circuit has an output which is connected to the analog input circuit 39 which, also receives the main power bus inputs for which monitoring control is provided. Analog input circuit 39 has an output which is connected to the accumulators comprising circuits 24, FIG. 2. Similarly, the accumulator control logic circuit 37 has an output which is also connected to the accumulator circuit 24 and to an on-line current display 40. The output of the on-line current display 40 is fed directly to the digital panel meter displays. Similarly, the program enable circuit 38 has an output which is coupled to the read-only memory multiplication table. The details of the various independent circuits which cooperate to comprise the timing control circuit 16 will be described in greater detail herein.

Referring to FIG. 4, the front panel view of the completed instrument is illustrated. As shown, the selector switch 19 selects between the 30 volt auxiliary system, the 60 volt port battery system or the 60 volt starboard battery system. Beneath switch 19 is the initiate switch 54. To the left of initiate switch 54, power on switch 53 is located. Directly above power switch 53 is the normal megger operation select switch 20. To the right of this four switch cluster, the digital panel meter readouts 21, 33, and 32 are positioned where they may be easily read by operational personnel. Additionally, front panel fuse access is provided. This front panel access permits rapid replacement of fuses for interruptions occasioned by temporary power overloads.

The capacity of a storage battery is conventionally expressed either in ampere-hour or watt-hour units. The term ampere-hour capacity indicates the quantity of electricity that the battery is able to deliver over an hour period of time. The watt-hour capacity, on the other hand, indicating a measure of the energy or ability of the battery to do work. The ampere-hour capacity of storage batteries is more often employed than the watt-hour capacity because it is more easily measured. In submarine vehicle applications the current requirement is the more important and controlling factor for safe vehicle operation.

The ampere-hour capacity of the battery is most easily ascertained when the current is constant during the period of discharge. In this constant current case the ampere-hours are equal to the product of the current amperes by the time in hours. If the current fluctuates with time, more difficulty is encountered and it is necessary to determine the integral $$C = \int_0^T I \, dt. \tag{1}$$

This value can be obtained by plotting the current as a function of time and integrating the curve. Such a curve 41 is illustrated at FIG. 5.

In the FIG. 5 illustrated example, the determination of consumed ampere-hours may be accurately determined with the use of a computing scheme that solves the integral presented above by the "rectangular rule" of integration. In this computation scheme the interval of integration, the area under curve 41, is divided into $n$ parts. The individual parts represent the system's sample rate ($dt$) which has the assigned multiplication value of $\Delta t$ (small increment of time). At the sample times we read the valves of system current requirements $I_1, I_2, \ldots, I_n$ at the midpoints of the $n$ intervals. At the time of each sample the value of I is multiplied by the $\Delta t$ value and the product is stored in an accumulator. The following samples are handled in this same manner such that all I·$\Delta t$ quantities are summed and stored in the accumulator. The result over any period of time is given by:

$$C = \sum_{t=0}^{n} I_t \Delta t = \int_0^T I \, dt. \tag{2}$$

The percentage of accumulated error inherent in this method of determining ampere-hours is reduced by assigning an extremely small value for $t$ thus increasing the sample rate of the monitoring system. By operatinng at this high sample rate even transients absorbed by the system are accumulated thus yielding an extremely accurate real-time value of consumed ampere-hours. The display of the accumulated values is accomplished by indicators interfaced to the accumulator.

As previously described, the system which is used to perform the above described mathematical functions comprises the following main sections:

1. Analog multiplexer and analog-to-digital converter, and
2. Digital processor. The analog multiplexer and analog-to-digital converter circuit 17 is made up of an analog card and a digital panel meter 18. The analog card accepts the analog voltage levels from the system's in-line shunts and multiplexes them to the digital panel meter at the proper processing time. The section is designed to isolate the submersible's system from the digital logic circuit of monitor 15 so that a megger test will not damage monitor 15.

The digital panel meter (DPM) 18, a conventional unit, performs the analog-to-digital conversion for monitor system 15. The digital output of DPM 18 connected directly to the processing section and to an "On-Line Current" display 21 on the face panel of monitor 15. A selector knob 19 on the panel controls which battery current is to be displayed.

The digital processing section contains the entire timing section of the unit and the logic necessary to compute and store the consumed ampere-hours for the two battery packs employed in the illustrated submersible. A major function of this section is the accurate accessment of consumed ampere-hours. The design of this section utilizes commercially available logic elements arranged in a logic circuit that functions in precise and reliable fashion. Also, this section employs a power-fail protection so that in the event of an AC power failure the last accumulated value of consumed ampere-hours is preserved. Upon the re-establishment of AC power the accumulated ampere-hours reading will begin from the point at which power failed. In this fashion a more accurate total power record is obtained.

The Amp-Hour Monitor 15 is divided into three logic sections which, when working in unison, produce the desired sequential reading and processing of consumed battery current. These areas consist of the Control Switch Logic, the Analog-to-Digital Section, and the Sampled Amp-Hour Section. Each of these areas will be expanded upon in the following description.

Before the individual section descriptions are presented, it is considered beneficial to review the logic symbology used in the descriptions. The symbology is illustrated in FIGS. 6(A), 6(B), 6(C), and 6(D).

Referring to FIG. 6(A) the NAND gate shown at 42 and 43 will have an output which will be set "lo" only when all its gate inputs are "hi." All other times its output is "hi." This condition is illustrated at the Table 44.

Referring to FIG. 6(B), the NOR gate illustrated at 45 and 46 has an output-input characteristic which is shown at table 47. As shown, the output will be se "hi" only when all its gate inputs are "lo". All other times its output will be "lo".

Referring to FIG. 6(C), the inverter gate, illustrated at 48 and 49 will always be the inverse of its one input signal as is shown in table 50.

The D flip-flop, illustrated as a labeled box 51, is a bistable device. The condition states are illustrated in a table 52. As shown, the D input is transferred to the Q output only at the positive edge of the clock pulse. The Clear and Preset inputs have control of the output regardless of clock and D input states. A "hi" at Preset forces Q=1. A "lo" at Clear forces Q=0.

The logic signals used in the gates and flip-flops may be represented in one of three conventional manners: 1 and 0, hi and lo, positive and ground. Since all the logic used in the Monitor is positive in nature "hi" corresponds to +5 VDC and a "lo" is equivalent to 0 VDC, or ground.

Referring to FIG. 7, the major control switches, the operator controls necessary for direct operation and control of the Amp-Hour Monitor, will be described. The basic control functions of these switches will be apparent and will be further explained in the Mode of Operation description, to follow.

The function of the Power ON/OFF switch 53 is to apply power to the Amp-Hour Monitor and to master clear the processing logic. When lock ON/OFF toggle switch 53 is set ON, the 115 VAC is bussed into the Monitor where it turns on the cooling fan and applies voltage for DC conversion at the switching-regulated power supply 55. When the power supply has reached 80% of its full voltage potential (+5VDC), a negative pulse is generated by a KPOMC circuit 56 (master clear). The master clear pulse is inverted by inverter 55 to yield the ISET signal which sets the initialize circuitry. The signal is also inverted through a NAND gate 64 to generate the RST pulse. The RST pulse resets the master clock stage, the $\overline{\text{CURDIS}}$ (current display control), and the CLKR and CLKS (S and R register control) circuits.

The logic's 5 volt power is also used as a charging voltage and sent, via diode 57, to a battery 58. The circuit is designed to allow the battery to constantly "trickle" charge the three AA size NICAD batterys in the battery pack 58.

The voltage potential of battery pack 58 is regulated by diode 59 and applied to the accumulator registers which rely on this voltage for operating current.

In the event that AC power (from the vessel's inverter) is lost, battery 58 will maintain the internal operating voltage. This ensures that the accumulated amp-hour reading will be preserved until power is re-established and new amp-hour samples are taken. This is an important feature in the operational environment.

When the monitor system is to be used for a newly generated monitoring sequence, it is imperative to begin the system from a zero status. A lock-momentary On switch 54 is available on the front panel to initiate the desired zero status for the entire system.

The initializing circuit consists of INITIATE switch 54 and a trailing-edge synch gate 61. Synch gate 61 uses two flip-flops, G1 and G2, and has a normal condition such that flip-flop G1 is equal to a one (Q=1) and flip-flop G2 is equal to a zero ($\bar{Q}$ = 0). This condition is initially assured by the ISET signal and subsequently maintained by CLKA and the pull-up potential on the D flip-flop input of G1.

When INITIATE switch 54 is engaged, a ground potential is applied to the D input of G1. On the next leading edge of CLKA the Q output of G1 goes "lo". This "lo" signal is NOR'd with the existing "lo" at the $\bar{Q}$ output of G2 by NOR circuit 62. This causes the normally "lo" CLREG signal to go "hi". The CLREG signal subsequently resets the 30 volt and the 60 volt accumulators to a zero condition. The "hi" output from NOR gate 62 is also inverted by inverter 63 and applied to a NAND gate 64 which generates a RST pulse resetting the control logic as previously described.

On the second leading edge of CLKA the "lo" signal from the INITIATE switch is still felt at the D input of G1 and the previous "lo" at G1's output is transferred to the Q output of G2. The $\bar{Q}$ output of G2 of course goes to a "hi" state and subsequently causes the NOR gate output to return "lo". The CLREG signal has thus lasted one clock period of CLKA.

When INITIATE switch 54 is released, the +5 VDC is again felt at the D input of G1. Within the next two leading edges of CLKA the initializing circuit is returned to its normally idle condition (Q = 1 at G1, and $\bar{Q}$ = 0 at G2).

In a typical system as used on the SEACLIFF and Turtle submersibles there are three separate shunts to be monitored because new current samples are taken at a 40 Hertz rate per shunt, it is necessary to have control over the on-line current display to ensure proper and readable shunt currents. An inherent characteristic of the digital displays accomplishes this task of proper on-line current display.

The displays have an internal memory latch that preserves the last current reading until it is forced to update that reading by the $\overline{CURDIS}$ signal. The $\overline{CURDIS}$ signal is generated by selectably AND'ing the MEN (memory enable) signal with the SEL60P (select 60 volt port shunt), SEL30 (select 30 volt system shunt), or SEL60S (select 60 volt starboard shunt) signal with wither the CLKR or CLKS pulse and the output of the divide by forty gate. A simplified diagram of the AND'-ing process is illustrated by FIG. 18.

Figure 18:
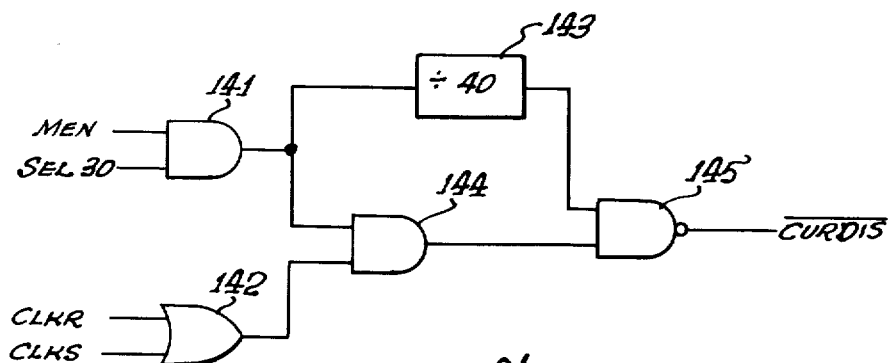
FIG. 18 is a simplified schematic diagram of the AND'ing circuit.

Referring to FIG. 18, the MEN signal is fed to AND gate 141 with the SEL30 signal. The output of and gate 141 is fed to a divider 143 where it is divided by forty. Too, the output of AND gate 141 is connected to AND gate 144 when it is combined with the output of OR GATE 143 which has the CLKR and CLKS signals as inputs. Both the divided outputs and the ORed outpts are NANDed by NAND circuit 145 to provide the desired $\overline{CURDIS}$ signal.

The function of the divide-by-forty circuit 143 is to allow the $\overline{CURDIS}$ signal to strobe the displays only once every forty current samples. This eliminates the uncomfortable display fluctuations while displaying a sufficiently accurate real-time current reading.

Figure 19:
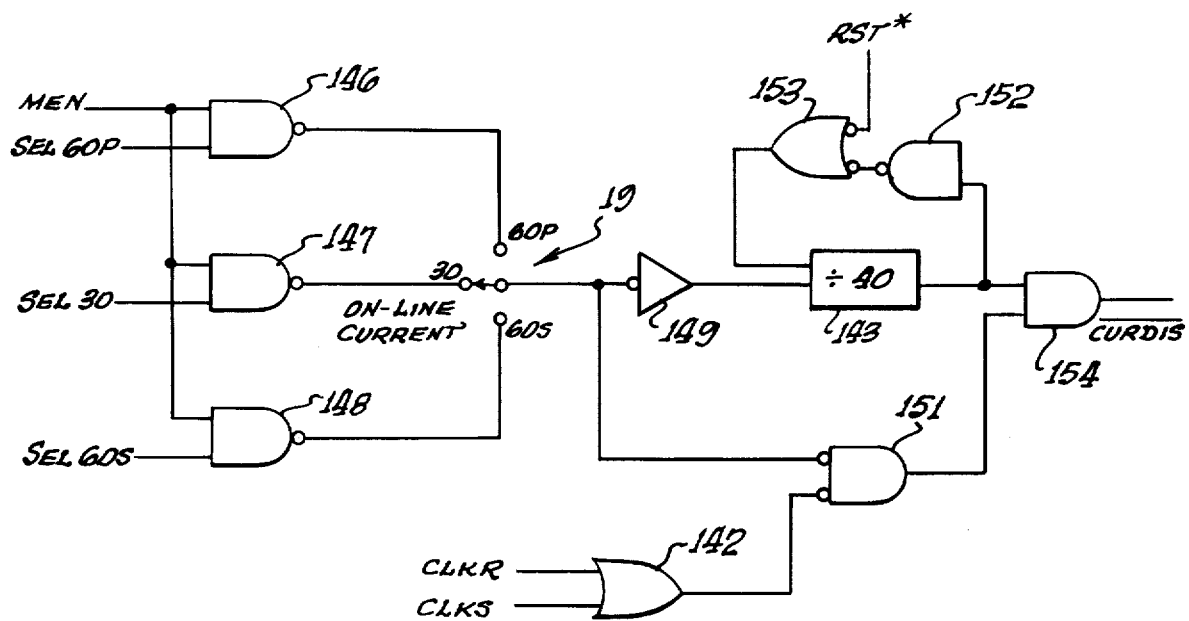
FIG. 19 is a schematic diagram showing the on-line current display circuit.

The circuit actually used in the monitor 15 is shown in FIG. 19. As shown, selections of the actual sampled shunt is obtained by a plurality of NAND gates 146, 147, and 148 by switch 19. The use of NAND gates rather than AND gates is due to considerations of chip utilization and is compensated for by an inverter 149 connected to the selected NAND gate by switch 19. Similarly NAND gates 152 and 153 provide for the reset signal to return the divide-by-forty gate 143 to a base count. Similarly, the signal polarity considerations account for the replacement of AND gate 144 and NAND gate 145 with NAND gate 151 and AND gate 154, respectively. Thus, the circuit of FIG. 19 comprises means to display an on-line current reading.

The detection and conversion of consumed current from the submersible's battery system is a critical area of the Amp-Hour Monitor 15. Voltages in the millivolt range must be read from the system shunts and accurately converted into equivalent digital values for the processing stage. The detection and conversion means used to accomplish this task will now to described.

The battery system aboard the typical submersible 11 is floating with respect to the hull. For this reason, and because occasional Megger tests are performed on the power packs, the input circuitry to the Amp-Hour Monitor is also floated and the ground of the analog input stage is isolated from hull ground.

Referring to FIG. 17, the circuit which is used to accomplish the isolation of the analog input stage is illustrated. Shunts 131, 132, and 133 detect the current from their associated battery banks and are connected to the inputs of ISO-OP-AMPS 134, 135, and 136 respectively. These state-of-the-art amplifiers fulfill the requirement of input-to-chassis isolation. Further, channel-to-channel interference rejection is insured by highly accurate modulation/demodulation provisions made possible by the gating of the optical couples 137, 138, and 139 which isolate the input from the output. The inputs to monitor 15 are always present at ISO-OP-AMPs 134, 135, and 136. A times three (X3) (OP amp 140 connected thereto corrects the 1-to-3 current-to-voltage reduction occurring at shunts 131, 132, and 133.

The $\overline{SEL60P}$, $\overline{SEL30}$, and $\overline{SEL60S}$ are sequentially applied to the ISO-OP-AMP modulation inputs 137, 138, and 139 cyclically present the corresponding currents to DPM 18. Additionally, DPM 18 receives a convert (CONV) signal and an end-of-conversion (EOC) signal from the timing section of Monitor 15.

The sequenced selection of a shunt by the control logic begins with the selection of the proper analog switch which is controlled by the appropriate selection signal, e.g., SEL60P. The analog value is passed to DPM 18 and, at the proper system time, the CONV signal is generated by the control logic which initiates the conversion of the analog input into an equivalent binary coded decimal value. EOC signal from the DPM will remain "hi" until the conversion process is complete. When the EOC signal drops to "lo", the processing logic uses the DPM digital output for the processing of an amp-hour sample value. Thereby establishing the inherent signal conversion capabilities of DPM 18 as previously described.

Figure 8:
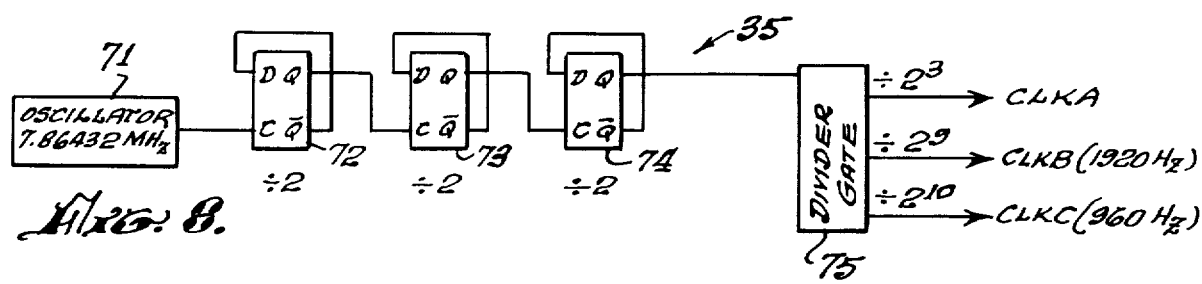
FIG. 8 is a diagrammatic showing of the clocking circuit and signal generators used in providing timing pulses for the invention.
Figure 9:
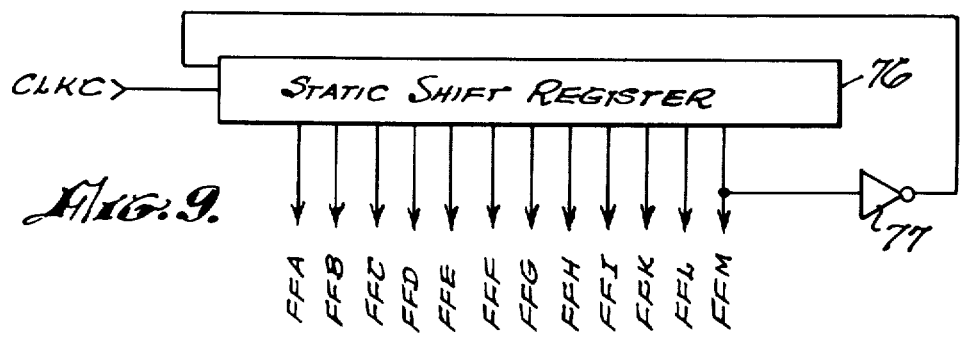
FIG. 9 is a schematic illustration of the shift register used for development of timing gates employed by the circuitry of the invention.
Figure 10:
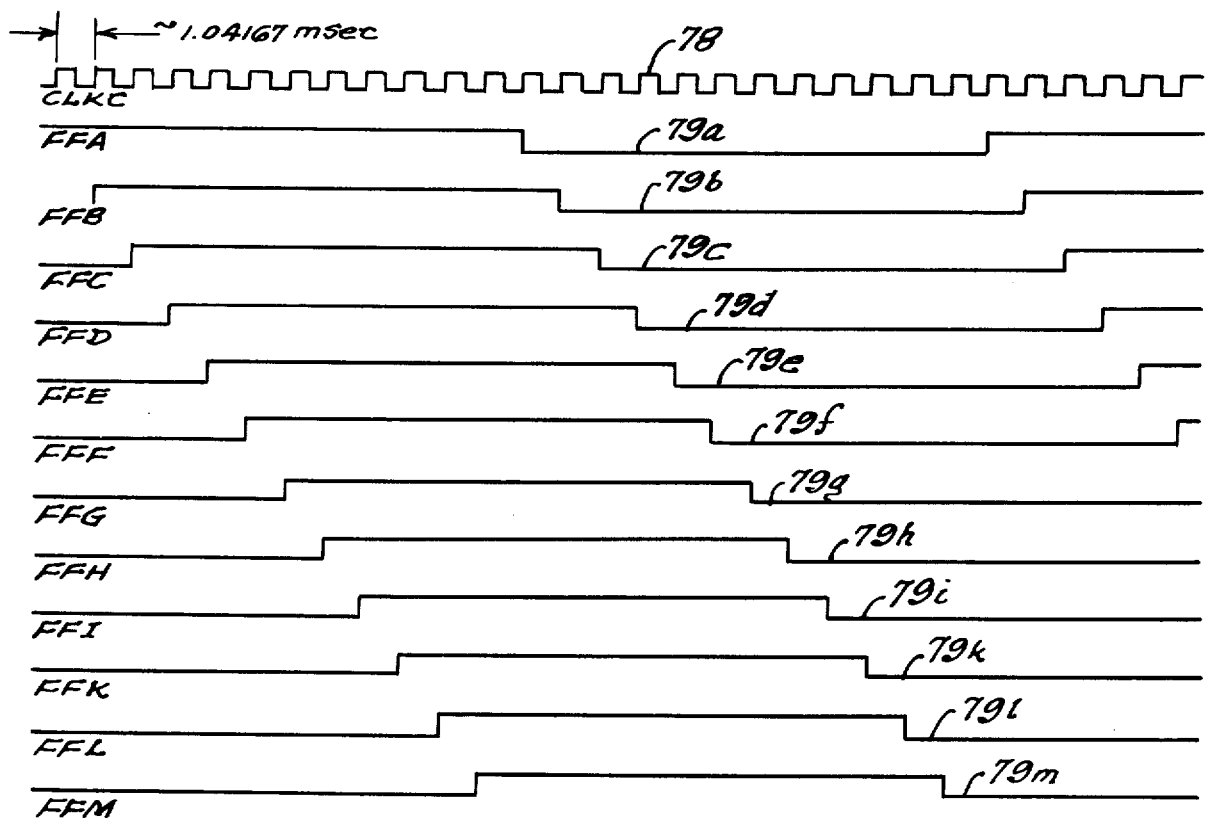
FIG. 10 is a waveform diagram showing the various timing gates used and the circuitry of the invention.

Referring to FIGS 8, 9, and 10, the Master Clock stage is illustrated. This circuitry provides means for generating, with a high degree of accuracy, the proper clock and phased control signals necessary for system operation. The designed accuracy of the Master Clock stage is based upon a DIP oscillator 71 which generates a square wave frequency of 7.86432 Megahertz. The output of the oscillator is passed through a divide-by-eight stage which is comprised by three individual divide-by-two stages 72, 73, and 74. This circuit reduces the frequency to 983040 Hertz. This reduced frequency is then passed through a CMOS "divide-by-N" register 75. The signals being used are CLKA ($f_r \div 8 = 122880$ Hertz), CLKB ($f_r \div 512 = 1920$ Hertz), and CLKC ($f_r \div 1024 = 960$ Hertz). CLKC, waveform 78, FIG. 10 is passed into a static shift register 76, FIG. 9, which generates 12 phase-shifted signals. The 12 phase-shifted signals, 79a through 79m, will be used to generate several important control signals by selectably creating synchronized time windows. An inverter 77 is connected in circuit with shift register 76 to provide the recirculation required. This circuitry is, therefore, seen to comprise a control signal generation means.

Once a shunt voltage has been multiplexed into the Analog-to-digital section including the circuitry feeding the Digital Panel Meter, a convert command (CONV) is required to initiate the Analog-to-Digital conversion at the Digital Panel Meter (DPM).

Figure 11:
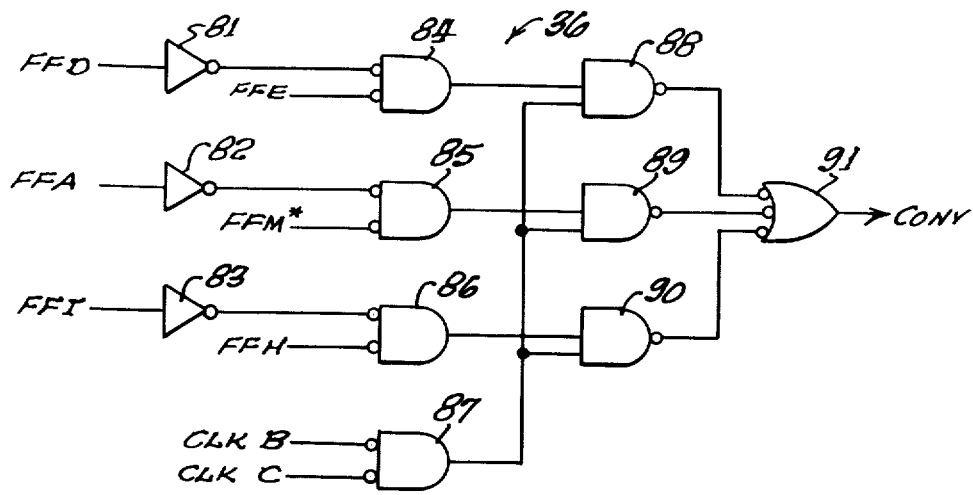
FIG. 11 is a schematic illustration of the digital panel meter convert command circuitry.
Figure 12:
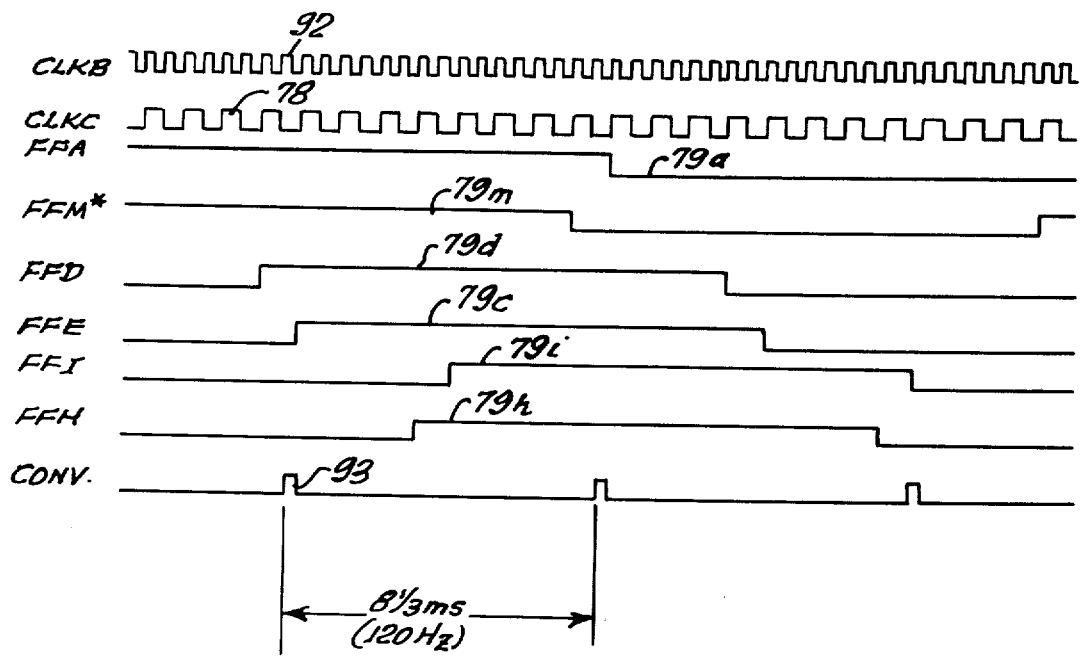
FIG. 12 is a waveform diagram showing the operational states of the circuit of FIG. 11.

Referring to FIGS. 11 and 12 the circuitry comprising the means for the generation of the CONV signal is illustrated. For example, if the 30 volt system shunt has been selected, it becomes necessary to AND FFA and FFM along with CLKB and CLKC to yield the CONV signal, waveform 93, FIG. 12. The pulse width of the CONV signal is one-half of the CLKB period (=260 usec) but has been shown wider for purposes of illustrative clarity.

When an analog signal has been resolved into a digital value, three digits of BCD information, it is converted to an equivalent 9 bit binary word. This binary word is used to address the Read Only Memory (ROM) stage 23. Once addressed, the ROM 23 outputs an amp-hour value corresponding to that sample address. ROM 23 has stored at a given 9 bit address an amp-hour value of a current sample taken during that time interval.

Because it is important that the logic be in a designated status before the memory is enabled, a time slot alignment is established by the phased clocks of the master timing section, previously described. It is during this time slot that verification of a valid digital shunt value is provided by the EOC command. Once this signal drops "lo" and CLKC is "lo" a MEN signal will be gated.

The circuitry for the generation of the MEN signal and the corresponding waveforms are shown in FIGS. 15 and 16 respectively. CLKC and EOC signals are NOR'ed by NOR circuit 121 the output of which is connected in parallel to three NAND gates 122, 123, and 124 which also receive FFL* and FFM, FFC* and FFD, and FFG and FFH* signals respectively. Their outputs are NANDed by NAND circuit 125 to produce the desired MEN signal shown as waveform 118, FIG. 16.

Figure 13:
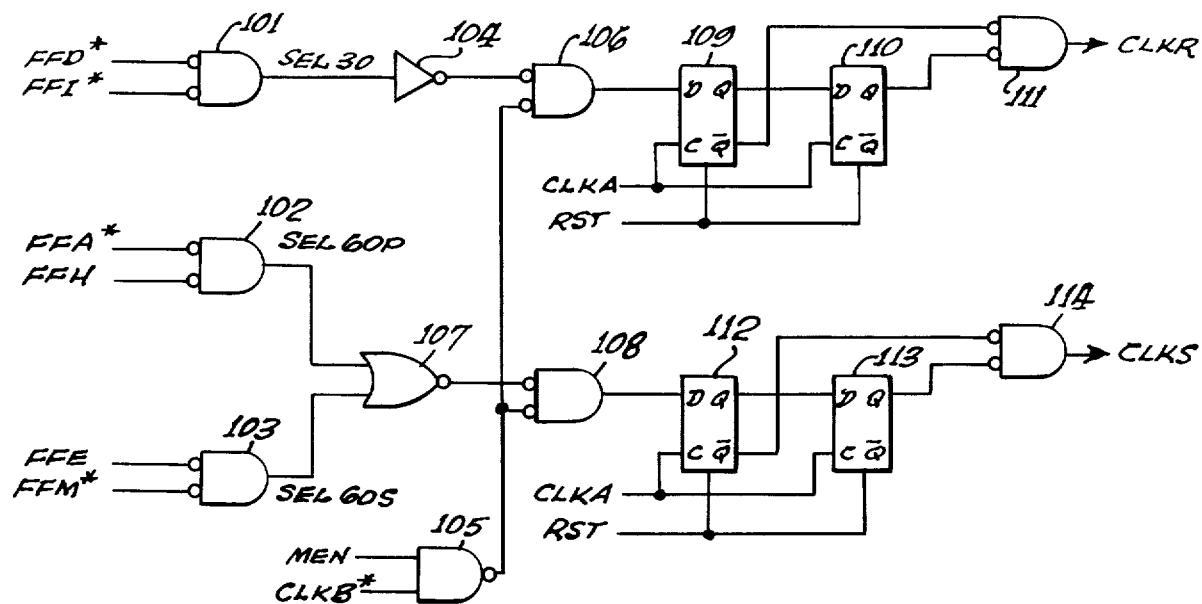
FIG. 13 is a schematic diagram of the accumulator control logic circuit.
Figure 14:
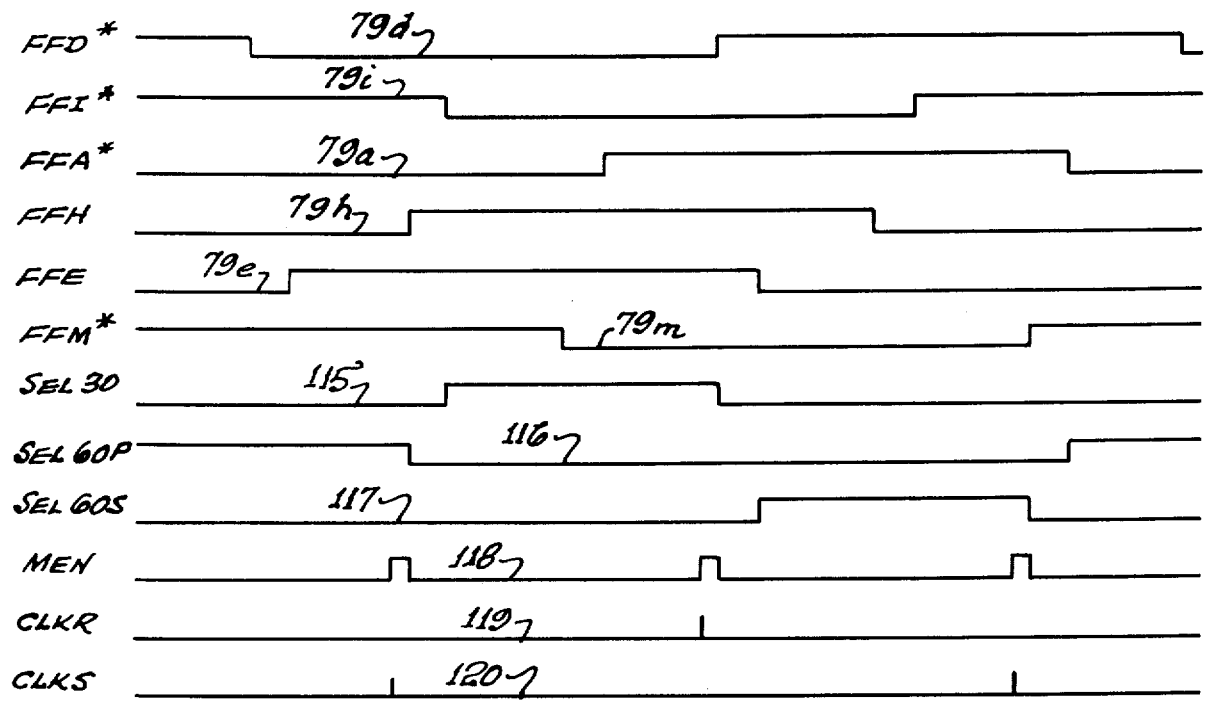
FIG. 14 is a waveform diagram showing the operational states of circuit of FIG. 13.

Referring now to FIGS. 13 and 14 the accumulator control logic circuits and control waveforms will be described. NOR gates 101, 102, and 103 receive the input signals illustrated to produce a plurality of SEL waveforms.

NOR gate 101 produces a SEL 30 signal from the FFD* and FFI* signals, 79d and 79i, FIG. 14. This SEL 30 signal is shown at 115 in FIG. 14. This output is NOR'ed by NOR gate 106 with the output from NAND gate 105 which NAND's the MEN and CLK B* signals. The output from NOR gate 106 is fed to a pair of flip-flop circuits 109 and 110. The $\bar{Q}$ output from flip-flop 109 and the Q output from flip-flop 110 are NOR'ed by NOR gate 111 to produce the CLKR signal 119.

In a similar fashion the CLKS signal 120 is generated. The outputs from NOR gates 102 and 103 are NOR'ed by NOR gate 107. The output of NOR gate 107 is connected to NOR gate 108 with the output of NAND gate 105. A pair of flip-flops 112 and 113 are connected to NOR gate 108 which, in turn, have their $\bar{Q}$ and Q outputs NOR'ed by NOR gate 114 which produces the desired CLKS signal.

During the time at which the memory is enabled, the amp-hour value at the given ROM address is available for storage at the output of the ROMs. This output is directly passed to the inputs of the accumulator adders 25 and 26, FIG. 2, which automatically adds this input to the previous total that is stored in the accumulator registers. After a short time delay, to allow for addition to be completed, the proper accumulator registers (i.e., either the 60 volt system or the 30 volt system registers) are given a clock pulse that causes the output of the adder to be stored.

Because both system accumulators are given the same ROM amp-hour values it becomes necessary to designate which register is to be clocked for the proper storage of the amp-hour sample. The designated clocking of the registers is accomplished by the CLKR signal 119 (30 volt system) and CLKS signal 120 (60 volt system). In this scheme it is seen that the register clocks are generated by AND'ing, NAND gates 106 and 108 the shunt selection signal with the MEN signal and the inverse of CLKB. The AND gate output is passed through a trailing-edge sync gate, 109 and 110, or 112 and 113, yielding the desired clock pulse having one period width of CLKA.

From the control timing it is seen that the 30 volt system accumulator register is clocked during the selection of the 30 volt system shunt and its MEM sample time. The 60 volt system accumulator register is clocked during the selection of either the 60 volt Port shunt, or the 60 volt Starboard shunt and the MEM sample time.

MODE OF OPERATION

The mode of operation of monitor 15 is that of the individual circuits, described above, acting in combination. However a discussion of the manual controls, FIG. 4 is believed to be of benefit in a complete description of the monitor. ON/OFF switch 53 controls the 115 VAC power to the monitor. It is fused at the back panel with a ¼ amp fuse. Of course, this switch must be operated prior to placing the system in operation. The AC input is converted into DC voltage within the Monitor which is utilized by the system's logic, the analog multiplexer, the digital panel meter, and an in-line battery charger that maintains a power-fail battery at full potential. Lock ON/OFF switch 53 also allows the flow of this battery voltage to the accumulator registers.

Initiate switch 54 is a lock/momentary toggle switch and is utilized only at the beginning of the monitoring sequence. Its function is merely to clear the accumulators 25 and 26 and should only be used when a new monitoring sequence is established.

Norm/meg switch 20 is a two position function switch and is incorporated into the system to offer protection to the input and processing logic at the time a Megger Test is performed. During a Megger Test the rotary switch is placed in the MEG position. In this position all analog input lines are opened and a zero current reading will be indicated on any selected "ON-LINE CURRENT" display. Under normal operating conditions the switch must be in the NORM position for current consumption from the batteries to be monitored.

The ON-LINE CURRENT switch 19 is a three-position rotary switch which enables the operator to monitor any of the three battery shunts at his discretion. The three shunts on the submersible are used to monitor current consumed from the 60 volt port battery, the 60 volt starboard battery, and the 30 volt battery system.

In addition to the operator controls monitor 15 is provided with a test connector panel that is accessible from the front panel of Monitor 15 behind the fuse cover. The connector panel contains a six pin connector and a seven position miniature toggle switch. During normal operation the first six positions of the switch are in the ON position. This allows shunt voltages to be processed by the Monitor. When a test of the Monitor functions is desired the test fixture (supplied for the Monitor) is connected to the panel connector. One or more of the Monitor channels may then be tested by closing the switches in pairs (i.e., 1 and 2, 3 and 4, or 5 and 6). The test fixture is designed to supply an appropriate amount of simulated shunt voltage for a selected length of time.

However, this test position directly alters the consumed amp-hour reading and is used during a test condition when the normal consumed amp-hour reading can be safely advanced.

The foregoing description taken together with the appended claims constitute a disclosure such as to enable a person skilled in the electronics and marine instrumentation arts to make and use the invention. Further, the circuitry herein described meets the aforestated objects of invention and generally constitutes a meritorious advance in the art unobvious to such an artisan befret of the benefit of these teachings.

Obviously, many modifications and variations of the present invention are possible in the light of the above teachings, and, it is therefore understood that within the scope of the disclosed inventive concept, the invention may be practiced otherwise than specifically described.

What is claim is:

1. A battery monitor system comprising:

input circuit means adapted to make connection with a battery pack for producing an electrical analog of the current therefrom;

digital panel meter means connected to said input circuit means for converting the output thereof to a binary code digital signal and displaying the display analog thereof;

first signal converter means connected to said digital panel meter means for converting the binary code digital signal output to a binary signal;

read-only-memory means connected to said first signal converter means and programmed to serve as a multiplication table storing the product of a time interval and a current corresponding to the binary input signal;

accumulator circuit means connected to said read-only-memory for summing the product outputs thereof;

second signal converter means connected to said accumulator circuit means for converting the digital output signal therefrom to a binary code signal;

panel display means connected to said second signal converter means for providing a visual read out; and timing control means connected to each of the aforerecited means for providing a timing signal therefor.

2. A battery monitor system according to claim 1 in which said input circuit means includes a switching arrangement to sample inputs from a plurality of battery packs.

3. A battery monitor system according to claim 1 in which said timing control means includes:

clear and initiate circuit means connected to power mains and to control switches for providing operational power and starting control signals;

a master clock connected to said clear and initiate circuit means for providing an uninterrupted chain of timing pulses;

a convert command circuit connected to said master clock for receipt of signals therefrom for generation of control pulses therefrom; and analog input circuit connected to said convert command circuit and connected to the battery packs to be monitored for sequentially selecting an individual battery pack.

4. A battery monitor system according to claim 3 in which said timing control means further includes:

accumulator control logic circuit means connected to said master clock to receive timing pulses therefrom for generating control pulses for timely activation of the aforesaid accumulator circuit means.

5. A battery control monitor according to claim 3 in which said timing control means further includes a PROM enable circuit connected to said master clock for generation of control pulses therefrom to control the aforesaid reach-only-memory means.

6. A battery control monitor according to claim 4 in which said timing control means further includes a PROM enable circuit connected to said master clock for generation of control pulses therefrom to control the aforesaid read-only-memory means.

* * * * *